Feb. 28, 1967 W. D. EISENHOWER, JR., ET AL 3,307,079

SEMICONDUCTOR SWITCH DEVICES

Filed Oct. 20, 1964 2 Sheets-Sheet 1

INVENTORS.
WALTER D. EISENHOWER, JR.
WALTER S. NOLL
NELSON E. AKE
Robert A. Green
ATTORNEY Feb. 28, 1967 W. D. EISENHOWER, JR., ETAL 3,307,079

SEMICONDUCTOR SWITCH DEVICES

Filed Oct. 20, 1964 2 Sheets-Sheet 2

INVENTORS.
WALTER D. EISENHOWER, JR.
WALTER S. NOLL
NELSON E. AKE
Robert Q. Green
ATTORNEY United States Patent Office 3,307,079

Patented Feb. 28, 1967

3,307,079

SEMICONDUCTOR SWITCH DEVICES

Walter D. Eisenhower, Jr., Millington, Walter S. Noll, Somerville, and Nelson E. Ake, Millington, N.J., assignors to Burroughs Corporation, Detroit, Mich., a corporation of Michigan Filed Oct. 20, 1964, Ser. No. 405,057

6 Claims. (Cl. 317—101)

This invention relates to semiconductor devices and, particularly, to multiple-zone devices having a plurality of external electrical contacts and useful as switches.

Various types of semiconductor devices having a plurality of zones of semiconductor material separated by P–N junctions are widely used in electronic circuits. Silicon controlled rectifiers and silicon controlled switches are examples of devices of this type, and, in these devices, there are four alternating zones of P-type and N-type silicon separated by P–N junctions with a separate external lead connected to each zone. Electrical signals may be applied to or extracted from the device through these leads.

Multiple-zone semiconductor devices have generally been made in the past by a zone-melting process in which a seed crystal of semiconductor material is drawn from a pool of semiconductor material, with first one impurity being added to form a zone of one type of material, and then a second impurity being added to provide material of opposite conductivity type. By adding the different impurities in the proper sequence, the desired zones of P-type and N-type material are obtained. However, this form of device is not completely satisfactory for present day use since it is relatively difficult to apply electrical contacts to each zone, and, in addition, the mechanical and electrical coupling of these devices with miniaturized circuit elements is relatively difficult to accomplish.

Accordingly, the objects of the invention are concerned with the provision of an improved multiple-zone, multiple-junction semiconductor device of a construction which simplifies the provision of electrical contacts on each zone and simplifies the coupling of the device with other circuit devices and elements.

Briefly, a semiconductor device embodying the invention comprises a crystal of semiconductor material of one conductivity type and has a pair of regions diffused therein of the opposite conductivity type. It is desirable to have one of the two regions entirely enclosed within the second, but not touching the second; i.e., the diffused areas are in a sense concentric and separated by a portion of the original crystal. An aperture is now formed in one of the two regions, and an impurity species of the same conductivity type as the original crystal is diffused or alloyed therein. Optionally, in the same operation, certain portions of the original crystal may be diffused at the same time to improve contacting the original surface. The device now includes the original crystal and three diffused regions. Such a series of diffused areas may be conveniently made using well known masking techniques. According to the teaching of this invention, the areas of diffusion are positioned so that, in a general way, they define a rectangular area. The crystal is now covered over its entire face with a relatively thick layer of insulating material, preferably a borosilicate glass. At this point, holes are formed in the glass coating to expose each of the four above-mentioned regions, and electrical contact is made to each.

The invention is described in greater detail by reference to the drawing wherein.

Figure 1:
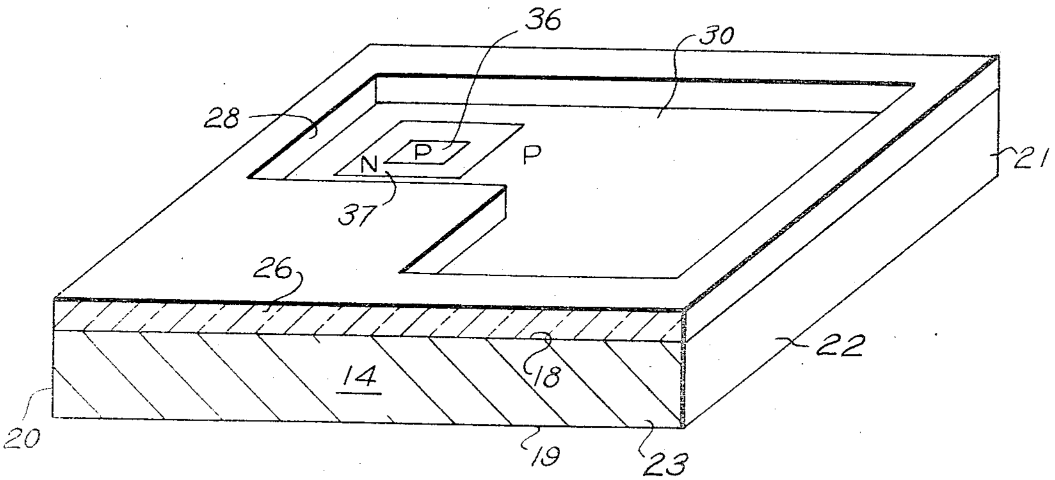
FIG. 1 is a perspective view of a device embodying the invention at one stage in its preparation.

A device 10 embodying the principles of the invention includes a body or crystal 14 of semiconductor material which may be silicon, germanium, or any other well known material. Let it be assumed that the crystal 14 is of N-type silicon and includes top and bottom surfaces 18 and 19 which are suitably lapped, cleaned, and polished. The crystal also includes sides 20, 21, 22, and 23. A protective coating 26 of an insulating material, preferably a glass-like material such as silicon dioxide, is formed on top surface 18 of crystal 14. Such a layer of silicon dioxide may be formed in any well known manner, for example, by heating in an oxygen atmosphere.

Next, a relatively large-area L-shaped portion 28 of the silicon dioxide layer 26 is removed by any suitable process, for example, by a chemical etching process or a photochemical etching process using appropriate masking means. After the L-shaped layer of silicon dioxide has been removed to expose the top surface of the crystal 14, a suitable impurity such as boron is diffused into the surface through a suitable mask to provide a first large-area L-shaped region 30 of P-type conductivity silicon and a second region 36 of P-type material adjacent to one end of one leg of the L-shaped region 30 and surrounded by an annular N-type zone 37 of the original crystal. In effect, the region 36 is formed near one corner of the crystal 14 near the juncture of sides 20 and 21. It is to be noted that P-type regions 30 and 36 are, in effect, concentric and are separated by the original N-type crystal 14 in zone 37.

Figure 2:
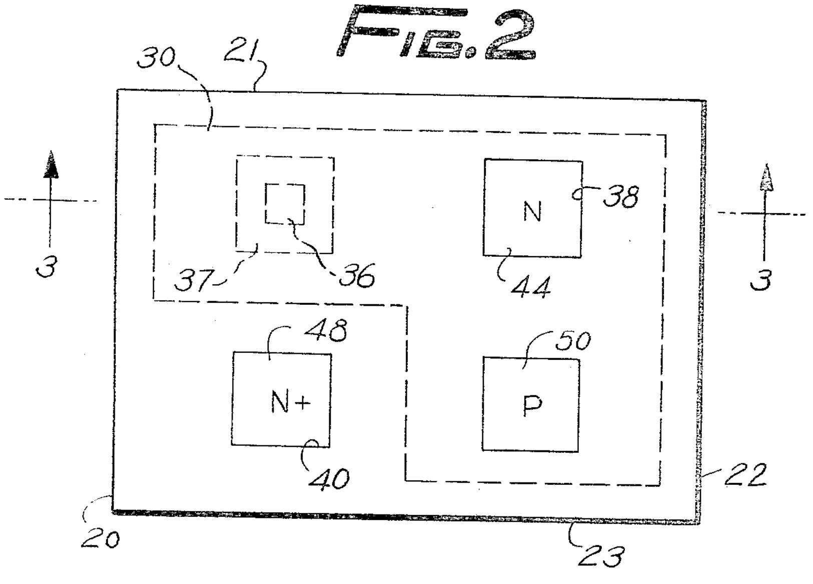
FIG. 2 is a plan view of the device shown in FIG. 1 at a later stage in its preparation.
Figure 3:
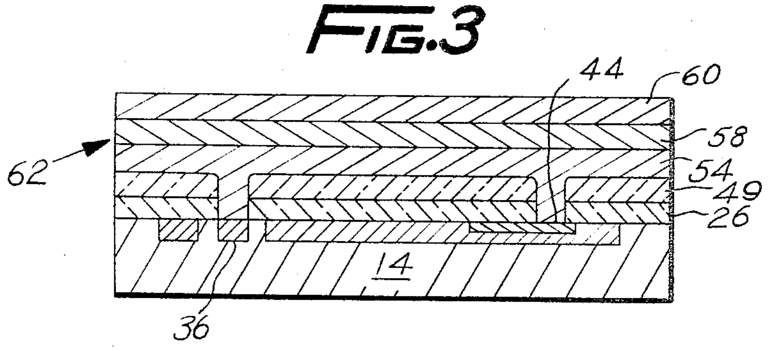
FIG. 3 is a sectional view, along the line 3—3 in FIG. 2, showing the device of FIG. 1 at another stage in its preparation.

A layer of silicon dioxide (FIG. 2) is formed again to cover the two P-type regions thus formed and any portions of the N-type crystal 14 which were exposed. Now, two other openings 38 and 40 are formed in the silicon dioxide layer, with opening 38 exposing the P-type region 30 at about the juncture of the legs of the L and the opening 40 exposing the original N-type crystal outside the L-shaped P-type region. Opening 30 is near the corner of the crystal 14 formed by the juncture of sides 21 and 22, and opening 40 is near the corner of the crystal formed by the juncture of sides 20 and 23. Region 36 and opening 38 are aligned parallel to side 21, and region 36 and opening 40 are aligned parallel to side 20. A phosphorous diffusion operation is now performed to provide a region 44 of N-type material in the P-type region exposed in the one aperture 38 and a region 48 of N+ material in the N-type crystal exposed in the other aperture 40. The region 48 insures subsequent ohmic contact to crystal 14. Silicon dioxide is again formed over all exposed areas of semiconductor material.

All of the zones of different conductivity type required for a four-zone SCS device are now present, and the next step is to provide an electrical contact to each zone. To perform this operation, the entire top surface of the crystal 14 and the various regions formed therein are coated with a relatively thick layer 49 of an insulating material, for example, a borosilicate glass in a layer 5 to 7 microns thick. Using a suitable mask, the last-mentioned glass layer and the silicon dioxide layers are now etched to provide apertures at the four corners of a rectangle to expose regions 36, 44, 48, and a region 50 of the P-type layer 30. Next, a layer of metal is evaporated over the entire surface of the crystal. Preferably, this layer includes first a thickness 54 of chrome and then a thickness 58 of silver. Then, another layer of metal 60, preferably silver, is electro-plated on the first evaporated layer to provide a relatively thick total layer 62 of metal over the entire top surface of the crystal. Finally, using an appropriate mask, the metal layer 62 is etched down a suitable depth, preferably to the layer of glass 49, to leave separate, raised contact terminals 64 over each of the regions 36, 44, 48, and 50. These terminals 64, which are elevated above the surface of the glass layer 49, may be used to make contact to printed circuit boards or other circuit elements to form an electronic module.

Figure 4:
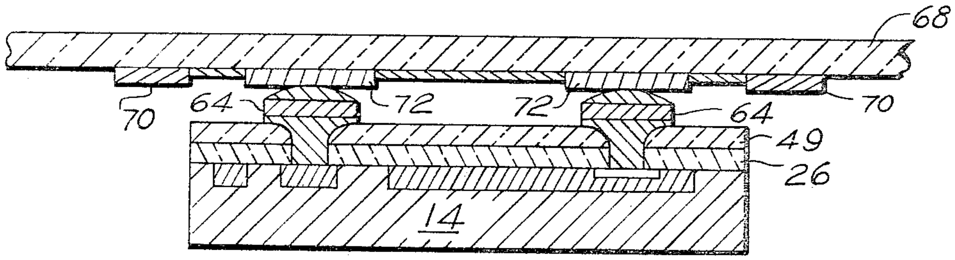
FIG. 4 shows the device of FIG. 3 as it appears when completed and showing one mode of combining it with other devices.
Figure 5:
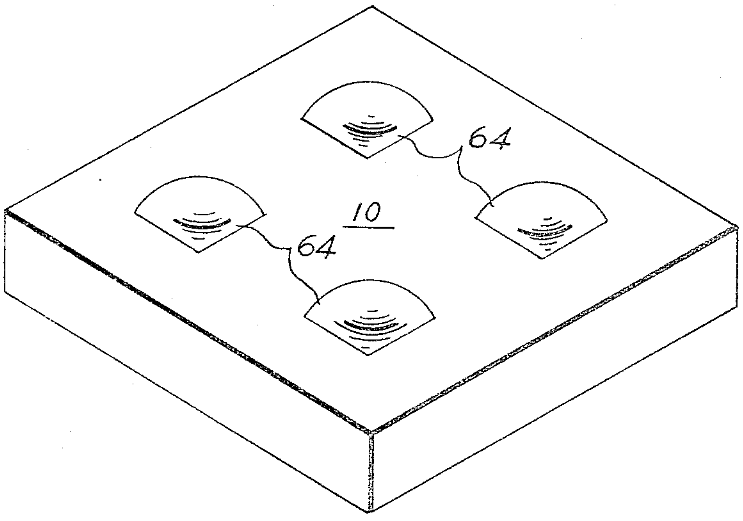
FIG. 5 is a perspective view of a completed device embodying the invention.

This type of module is shown in FIG. 4 wherein a circuit board is provided which comprises an insulating member 68 which carries resistors, capacitors, or the like represented schematically at 70. The board also carries contact pads 72. The manufacture of boards of this type is well known and need not be described in detail. The SCS device 10 of the invention is secured to the circuit board by means of its raised contact elements 64 which may be soldered in simple fashion to contact pads 72. Thus, a small, compact electronic package or module is provided.

It is clear that, if desired, a semiconductor device having fewer than four zones or more than four zones may be prepared according to the principles of the invention.

Those skilled in the art will appreciate that the drawings are not dimensionally exact and all parts are shown enlarged for purposes of illustration.

What is claimed is:

1. A multiple-zone semiconductor device comprising a crystal of semiconductor material of one type of conductivity having a surface adapted to receive impurity material to form P–N junctions, a first relatively large-area region of semiconductor material of opposite conductivity type in said surface of said crystal, a second region of said opposite conductivity type formed in said surface of said crystal inside the area defined by said first region and surrounded by a region of material of said first conductivity type, a third region of said one conductivity type formed inside the area defined by said first region, a fourth region of said one type of conductivity formed in said surface of said crystal, said first, second, third, and fourth regions being shaped and oriented so that they, in effect, define the four corners of a rectangle on said surface of said crystal, a layer of insulating material over the entire surface of said crystal and all of the regions of different types formed therein, and an ohmic electrical contact through said insulating layer to said first, second, third, and fourth regions, said contacts comprising relatively large masses of metal rising above said layer of insulating material whereby contact may be readily made thereto.

2. The device defined in claim 1 wherein said ohmic electrical contacts are spaced apart so that they define the corners of a rectangle.

3. The device defined in claim 1 wherein, in addition to said insulating layer, each of the P–N junctions formed in the semiconductor crystal is provided with a protective coating.

4. The device defined in claim 1 wherein, in addition to said insulating layer, each of the P–N junctions formed in the semiconductor crystal is provided with a protective coating of silicon dioxide.

5. A multiple-zone semiconductor device comprising a crystal of semiconductor material of one type of conductivity having top and bottom surfaces, a first relatively large-area, generally L-shaped region of semiconductor material of opposite conductivity type in the top surface of said crystal, said L-shaped region having first and second legs, a second region of said opposite conductivity type formed in the top surface of said crystal inside the area defined by said first region and near the end of one leg thereof and surrounded by a region of material of said first conductivity type, a third region of said one conductivity type formed inside the area defined by said first region and near the end of the other leg thereof, a fourth region of said one type of conductivity but of greater conductivity formed in the top surface of said crystal outside of the area defined by said L-shaped region, said first, second, third, and fourth regions being shaped and oriented so that they, in effect, define the four corners of a rectangle on said top surface of said crystal, a layer of insulating material over the entire top surface of said crystal and all of the regions of different types formed therein, and an ohmic electrical contact through said insulating layer to said first, second, third, and fourth regions, said contacts comprising relatively large masses of metal rising above said layer of insulating material whereby contact may be readily made thereto.

6. The device defined in claim 5 wherein each ohmic electrical contact includes, in order, a thin layer of chromium in contact with the semiconductor material, a thin layer of silver in contact with said layer of chromium, and a large mass of silver in contact with said thin layer of silver.

References Cited by the Examiner

UNITED STATES PATENTS

| | | |
|---|---|---|
| 3,090,873 | 5/1963 | Mackintosh. |
| 3,184,831 | 5/1965 | Siebertz. |
| 3,197,710 | 7/1965 | Hung Chang Lin ---- 317—101 X |

ROBERT K. SCHAEFER, *Primary Examiner.*

J. BOSCO, R. S. MACON, *Assistant Examiners.*